United States Patent
Matsubara

[11] Patent Number: 6,015,316
[45] Date of Patent: Jan. 18, 2000

[54] CIRCUIT BOARD MOUNTED CONNECTOR AND CONTACT USED IN THE SAME

[75] Inventor: Norihiro Matsubara, Kanagawa, Japan

[73] Assignee: The Whitaker Corporation, Wilmington, Del.

[21] Appl. No.: 09/066,254

[22] Filed: Apr. 24, 1998

[30] Foreign Application Priority Data

Mar. 6, 1997 [JP] Japan .................................... 10-73557
May 16, 1997 [JP] Japan .................................... 9-143084

[51] Int. Cl.$^7$ ................................................ H01R 13/405
[52] U.S. Cl. ............................................ 439/736; 439/876
[58] Field of Search ..................... 439/83, 876, 733.1, 439/736

[56] References Cited

U.S. PATENT DOCUMENTS

| 3,497,952 | 3/1970 | King et al. ................................. 29/629 |
| 3,761,871 | 9/1973 | Teurlings . |
| 4,077,694 | 3/1978 | Cobaugh et al. . |
| 4,469,394 | 9/1984 | Verhoeven .............................. 439/876 |
| 5,137,454 | 8/1992 | Baechtle .................................... 439/62 |
| 5,190,483 | 3/1993 | Viselli ..................................... 439/751 |
| 5,462,456 | 10/1995 | Howell ................................. 439/733.1 |
| 5,788,539 | 8/1998 | Fedder ..................................... 439/83 |

FOREIGN PATENT DOCUMENTS

| 0271357 | 6/1988 | European Pat. Off. ............... 439/876 |
| 48-32881 | of 1973 | Japan ......................................... 60/21 |
| WO 98/24148 | 6/1998 | WIPO .............................. H01R 9/09 |

*Primary Examiner*—Lincoln Donovan
*Assistant Examiner*—J. F Duverne

[57] ABSTRACT

Press-fitting sections (54) of contacts (50) of a circuit board mounted connector (10) have a plurality of conical recesses (60) formed in both surfaces (59a,59b). In each recess (60), central portion (61) of the recess (60) is located at a lower position than the plate surface (59a, 59b), while a circumferential rim portion (63) of each recess (60) is located at a higher position than the surface (59a, 59b), thus forming a substantially annular protruding portion. Inside surfaces of cavities (23) of housing (20) that is softened as a result of heat conduction during soldering performed after the contacts (50) have been press-fitted in the cavities (23) of the housing (20) flows inside and outside the recesses (60) and is hardened so that a complementary shape is formed in the recesses (60) and around the rim portions (63). Accordingly, the contacts (50) can be firmly held in the cavities (23) even after soldering has been performed.

28 Claims, 4 Drawing Sheets

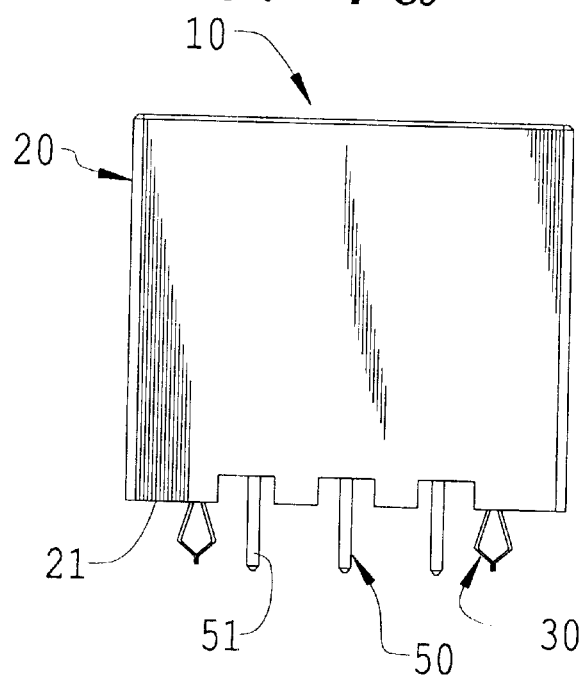
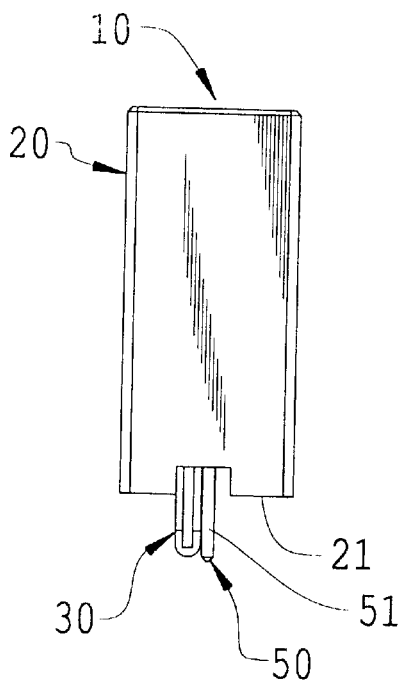
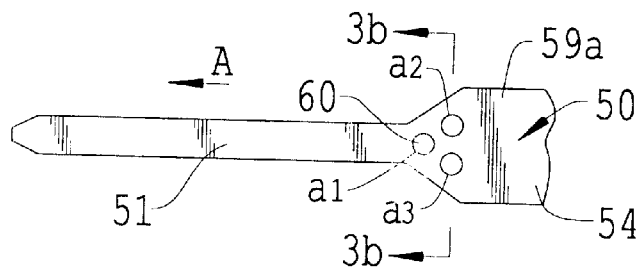
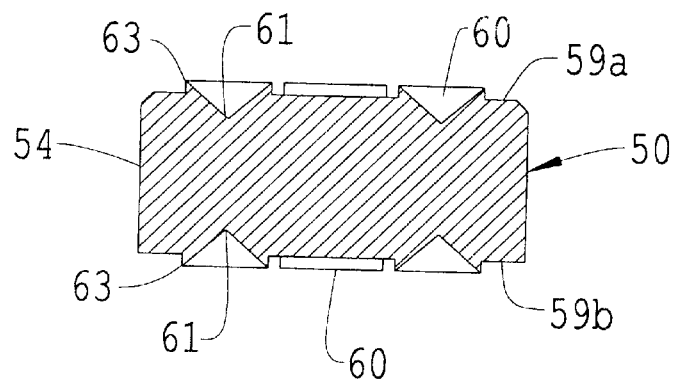

CIRCUIT BOARD MOUNTED CONNECTOR AND CONTACT USED IN THE SAME

FIELD OF THE INVENTION

The present invention relates to a circuit board mounted connector in which electrical contacts are fastened by press-fitting in an insulating housing, and an electrical contact used in the connector.

BACKGROUND OF THE INVENTION

One example of an electrical contact in which an electrical contact is fastened within a dielectric housing by press-fitting is disclosed in Japanese Utility Model Application No. 48-32881. The electrical contact has projections that protrude laterally from both side edges of a metal stamping; the contact is fastened in place as a result of the projections biting into side walls of a cavity in the dielectric housing.

However, especially in cases where electrical contacts are parts of circuit board mounted connectors, and include tine sections that are soldered to circuit boards, the contacts transmit heat when the tine sections are soldered to the circuit board so that the retaining force obtained by press-fitting in the cavity is weakened.

Accordingly, a feature of the present invention is to provide a circuit board mounted connector that is constructed so that electrical contacts of the connector are firmly held in an insulating housing even after the contacts have been connected by soldering to a circuit board, and an electrical contact that is used in the housing.

SUMMARY OF THE INVENTION

The present invention is directed to a circuit board mounted connector equipped with an insulating housing, and electrical contacts that are formed from metal stampings and that include press-fitting sections that are press-fitted in press-fitting cavities formed in the insulating housing, and tine sections that are soldered to a circuit board. Substantially conical recesses are formed in both surfaces of the press-fitting sections, with the central portions of the recesses being located at positions that are lower than the corresponding surfaces, and with circumferential rim portions at the recesses being located at positions that are higher than the corresponding surfaces; and the press-fitting cavities have dimensions that are substantially equal to the thickness dimensions between the surfaces of the press-fitting sections.

Preferably, both side edges of the press-fitting sections form substantially flat surfaces with no projections, and the width dimensions of the press-fitting cavities are smaller than the widths between the side edges of the press-fitting sections.

The present invention is also directed to a circuit board mounted connector equipped with an insulating housing, and electrical contacts that are formed from metal stampings and that include press-fitting sections that are press-fitted in press-fitting cavities formed in the insulating housing, and tine sections that are solderable to a circuit board, protruding members that protrude from both plate surfaces of the press-fitting sections and recessed portions that are recessed from the surfaces are formed side-by-side in the surfaces; and the press-fitting cavities have dimensions that are substantially equal to the thickness dimensions between the surfaces of the press-fitting sections.

The present invention is further directed to an electrical contact that is formed from a metal stamping and that includes a tine section that is solderable to a circuit board, and a press-fitting section that is fastened by press-fitting in an insulating housing of an electrical connector; substantially conical recesses are formed in both surfaces of the press-fitting section, with the central portions of the recesses being located at positions that are lower than the corresponding surfaces, and with circumferential rim portions of the recesses being located at positions that are higher than the corresponding surfaces so that protruding portions are formed.

Preferably, the recesses are formed in three places in each of the surfaces. The three places are located symmetrically with respect to a central axis of the electrical contact and are positioned at the vertices of an isosceles triangle, with one point located on the central axis on the press-fitting section, and with the other two points located symmetrically with respect to the central axis on an opposite side from the press-fitting direction.

In addition, the present invention is directed to an electrical contact that is formed from a metal stamping and that includes a tine section that is solderable to a circuit board, and a press-fitting section that is fastened by press-fitting in an insulating housing of an electrical connector, protruding portions that protrude from both surfaces of the press-fitting sections and recessed portions that are recessed from the surfaces are formed side-by-side in the surfaces.

Preferably, the protruding portions and the recessed portions form rows, or are formed in a matrix pattern.

Preferably, the protruding portions and the recessed portions are formed in opposing positions on the front and back surfaces.

An electrical connector for mounting onto a circuit board comprises a dielectric housing having press-fitting cavities; electrical contacts having press-fitting sections are press fitted into the press-fitting cavities and tine sections for soldered connection to the circuit board, wherein recess portions are located in surfaces of the press-fitting sections and protruding portions extend outwardly from the surfaces of the press-fitting sections so that when the tine sections are soldered to the circuit board, the housing material in the press-fitting sections will flow so as to correspond to the shape of the recess portions and protruding portions thereby securely retaining the contacts in the housing.

An electrical contact for mounting in a press-fitting cavity of a dielectric housing comprises a press-fitting section for press-fitting engagement with the press-fitting cavity and a tine section wherein recess portions are located in surfaces of the press-fitting sections; and protruding portions extend outwardly from the surfaces of the press-fitting section so that when the tine section is soldered to a circuit board, the housing material in the press-fitting section will flow so as to correspond to the shape of the recess portions and the protruding portions thereby retaining the contact in the housing.

BRIEF DESCRIPTION OF THE DRAWINGS

The present invention will now be described by way of example with reference to the accompanying drawings in which:

FIGS. 1a and 1b illustrate a circuit board mounted connector with FIG. 1a showing a front view and FIG. 1b showing a side view.

FIGS. 3a and 3b show a detailed shape of an electrical contact with FIG. 3a being a part plan view that shows only a press-fitting section and tine section, and FIG. 3b being an enlarged cross-sectional view taken along line 3b—3b in FIG. 3a.

FIGS. 4a and 4b illustrate an alternative embodiment of the electrical contact with FIG. 4a being a part plan view that illustrates only the press-fitting section and the tine section, while FIG. 4b is an enlarged cross-sectional view taken along line 4b—4b in FIG. 4a.

FIGS. 5a and 5b illustrate another embodiment of the electrical contact with FIG. 5a being a part plan view that illustrates only the press-fitting section and the tine section, while FIG. 5b is an enlarged cross-sectional view taken along line 5b—5b in FIG. 5a.

DETAILED DESCRIPTION OF THE INVENTION

Figure 2A:
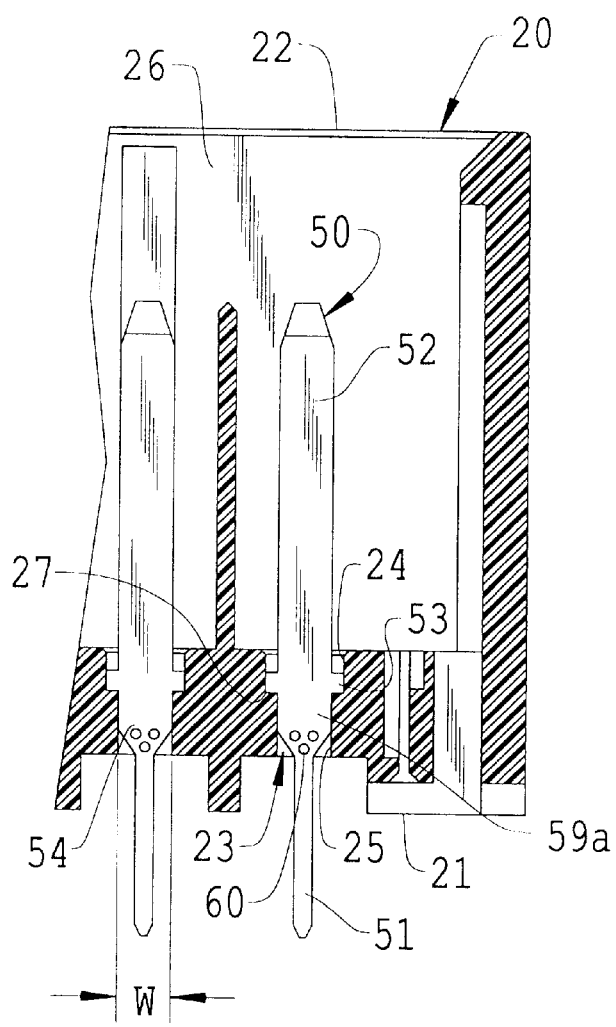
FIGS. 2a and 2b are part cross-sectional views that show electrical contacts fastened by press-fitting in the housing with FIG. 2a being a view from the front and FIG. 2b being a view from the side; retention legs are omitted from FIGS. 2a, 2b.

As shown in FIGS. 1a and 1b, the circuit board mounted connector 10 has a plurality of electrical contacts 50, that are securely held in a dielectric housing 20 made of a suitable resin. The contacts 50 have tine sections 51, that are used for soldering connection to through-holes in a circuit board (not shown). Tine sections 51 protrude from a bottom surface 21 of the housing 20. A pair of retention legs 30 are installed on the bottom surface 21 of the housing 20 so that they protrude in the same direction as the tine sections 51. The retention legs 30 act to retain the circuit board mounted connector 10 on the circuit board temporarily, until the tine sections 51 are soldered.

Figure 2B:
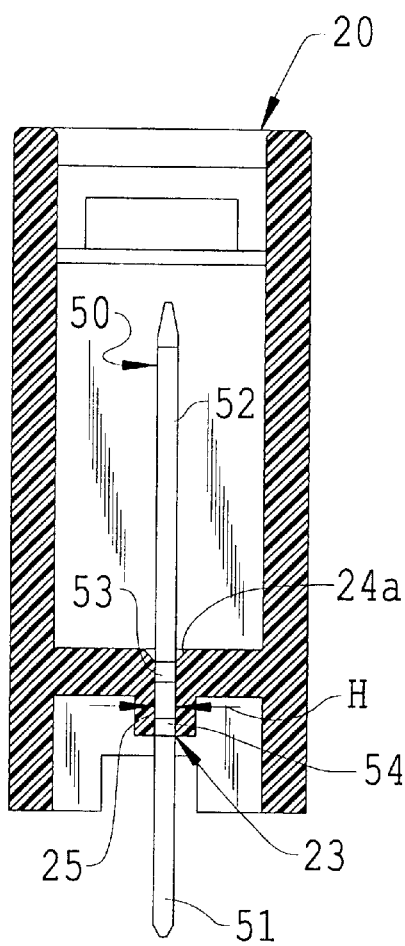

As seen from FIGS. 2a and 2b, the contacts 50, stamped and formed from a metal sheet, are fastened in place by being press-fitted in cavities 23 from an engaging end 22 of the housing 20. Each cavity 23 has a wide section 24 that accommodates wing members 53 of the corresponding contact 50, and a press-fitting supporting section 25 in which press-fitting section 54 of the contact 50 is fastened in place by being press-fitted therein. The wing members 53 engage shoulders 27 positioned at a boundary between the wide section 24 and the press-fitting supporting section 25 inside each cavity 23, so that the press-fitting of the contact 50 within cavity 23 is limited. As shown in FIG. 2b, the wide section 24 includes an inclined guide surface 24a that guides the accommodation of the corresponding contact 50 into cavity 23. When the contact 50 is press-fitted in position in cavity 23, contact tab 52 of the contact 50 is positioned inside a recess 26 in the housing 20. Although details are not shown in the drawings, the parts are formed so that the lateral width W of the press-fitting supporting section 25 of each cavity 23 prior to press-fitting the press-fitting section 54 therein is narrower than the width of the press-fitting section 54 of the corresponding contact 50. For example, the lateral width W is approximately 1.8 mm, and the plate width of the press-fitting section 54 of each contact 50 is approximately 1.9 mm. Accordingly, each contact 50 is secured inside the corresponding cavity 23 of the housing 20 in the direction of width.

As seen from FIG. 2a and FIGS. 3a and 3b, a plurality of conical recesses 60 are formed in surfaces 59a,59b of the press-fitting section 54 of each contact 50. As is clear from FIG. 3b, the recesses 60 are formed in three places on each of the surfaces 59a,59b of the press-fitting section 54. The recesses 60 are formed in each of the surfaces 59a,59b in positions corresponding to the vertices of an isosceles triangle whose axis of symmetry is the central axis of the contact 50 in the direction of length. Specifically, the recesses 60 are formed at one point a1 located on the central axis at a tip end in the press-fitting direction indicated by arrow A in FIG. 3a, and at two points a2 and a3 located at symmetrical positions with respect to the central axis on the opposite side from the direction of press-fitting. Furthermore, although details are not shown, the three recesses 60 formed in each of the surfaces 59a,59b are formed so that the recesses 60 formed in each surface are located in positions that substantially coincide with the positions of the recesses 60 formed in the opposite surface. The recesses 60 are formed in the surfaces 59a, 59b of the press-fitting section 54 using a part with a protruding shape whose tip end has a conical shape. Accordingly, in each recess 60, as shown in FIG. 3b, the central portion 61 of the recess 60 is located at a lower position (i.e., further to the inside) than the surface 59a or 59b, while a circumferential rim portion 63 of each recess 60 protrudes from the surface 59a or 59b so that this rim portion 63 is located at a higher position (i.e., further to the outside) than the surface 59a or 59b, thus forming a substantially annular protruding portion. For example, in the present embodiment, the central portion 61 of each recess 60 is located at a position that is approximately 0.12 mm lower than the surface 59a or 59b, while the circumferential rim portion 63 of each recess 60 is located at a position that is approximately 0.03 mm higher than the surface 59a or 59b. Furthermore, as seen from FIG. 2b, the longitudinal width H of each press-fitting supporting section 25 formed in the housing 20 is substantially equal to the thickness of the press-fitting section 54 of the corresponding contact 50. For example, in the present embodiment, both the longitudinal width H of each press-fitting supporting section 25 and the thickness of each press-fitting section 54 are set at approximately 0.64 mm. Accordingly, the press-fitting supporting section 25 of the cavities 23 prevent looseness of the contacts 50 in the direction of the thickness of the press-fitting sections 54 and offer press-fitting support of the protruding circumferential rim portions 63. In particular, since the recesses 60 are formed in positions corresponding to the vertices of an isosceles triangle on the surfaces 59a,59b, the press-fitting sections 54 can be stably held in position in the press-fitting supporting sections 25.

As is clear from FIG. 2b, the thickness and the longitudinal width of each cavity 23 are also substantially equal in the area where the wing members 53 are supported in the wide section 24; accordingly, the contact 50 is supported so that looseness is prevented in this area as well. In particular, since the wing members 53 are maintained in substantial engagement with the shoulders 27, movement of the contact 50 in the direction of rotation is prevented in cases where a rotational moment is applied to the contact 50 in the direction of the surfaces.

The presence of the recesses 60 described above is not merely a feature of the press-fitting structure; additional effects of these recesses will be understood by considering the state in which the circuit board mounted connector 10 is mounted and soldered on a circuit board. As was described above, after the circuit board mounted connector 10 has been initially mounted on the circuit board, the tine sections 51 of the contacts 50 are connected by soldering to through-holes formed in the circuit board. In the case of a header-type connector such as the circuit board mounted connector 10, as shown in the drawings, the press-fitting sections 54 are formed in close proximity to the tine sections 51. Accordingly, heat is conducted to the contacts 50 during soldering, and there is a danger that the heat conducted to the press-fitting sections 54 will soften the inside walls of the cavities 23 formed in the housing 20 so that the press-fitting retaining force inside the cavities is weakened. However, if recesses 60 are formed as described above, any softened housing material will flow so that a complementary shape is formed in the recessed central portions 61 and protruding circumferential rim portions 63. The housing material that has thus flowed will harden when soldering is completed. Accordingly, although there is a possibility that the press-fitting retaining force will be slightly weakened, the recesses 60 interact with the inside surfaces of the cavities 23 so that the retaining force applied to the contacts 50 is further strengthened. As one example, when the respective retaining forces of contacts with no recesses 60 and contacts with recesses 60 were compared for contact cavities 23 of the same shape following heat treatment resulting from soldering, the retaining force of contacts with no recesses 60 ranged from 0.4 to 0.6 kg, while the retaining force of contacts 50 with recesses 60 ranged from 0.8 to 1.1 kg. Thus, an approximate two-fold difference in retaining force following heat treatment was observed.

Figure 4A:
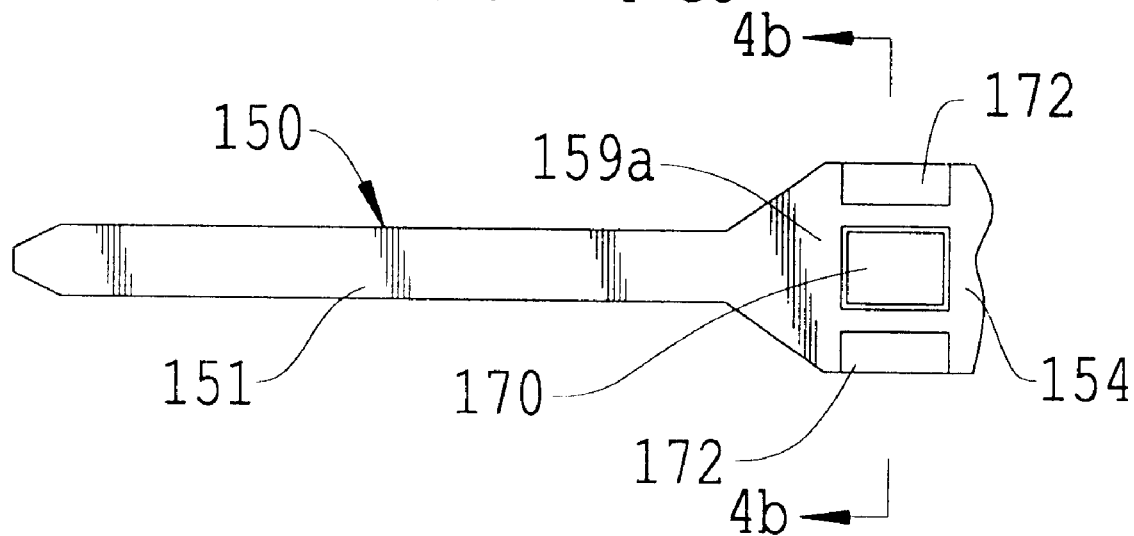
Figure 4B:
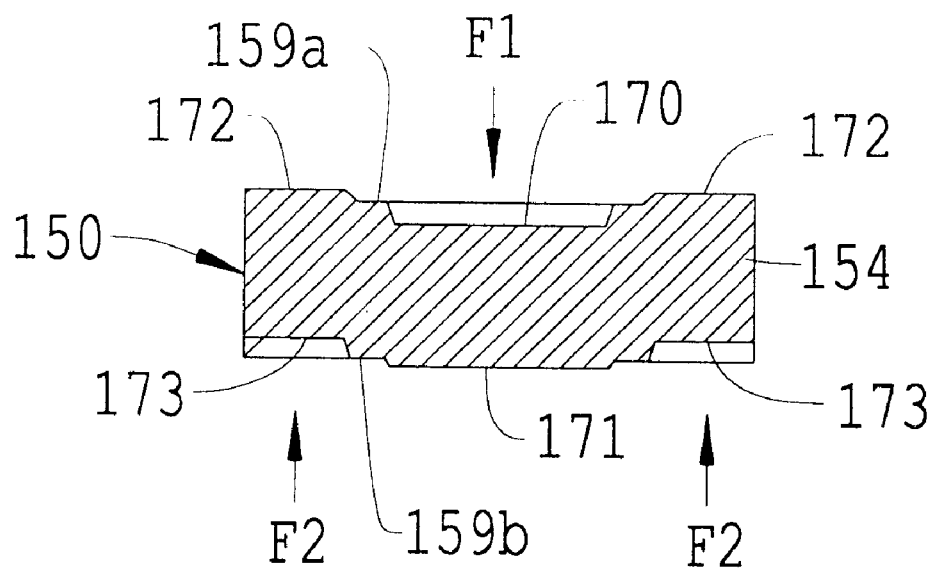

FIGS. 4a and 4b illustrate an electrical contact 150 for use in a circuit board mounted connector that constitutes an alternative embodiment of the present invention. Contact 150 has an external shape similar to that of the first embodiment although the entire contact is not shown. Contact 150 is press-fitted in the housing in the same manner as the contact 50 shown in FIGS. 1a, 1b and 2a,2b. As in the case of the contact 50, the width of each contact cavity formed in the housing may be made narrower than the width of the press-fitting section 154. Furthermore, the vertical width of the cavity may be caused to coincide substantially with the width of the press-fitting section 154. The tine section 151 of the contact 150 is formed with the same thickness as the press-fitting section 154 and extends from the press-fitting section 154.

The contact 150 differs from the contact 50 in the shape of its press-fitting section 154. In the press-fitting section 154 of the contact 150, a recessed portion 170 is formed in the center of the surface 159a on one side, and protruding portions 172 are formed in positions along the edges on both sides of the recessed portion 170. The protruding parts 172 protrude from the surface 159a, and the recessed portion 170 is recessed in the surface 159a. Furthermore, a protruding portion 171 is formed in the center on the surface 159b located on the other side of the press-fitting section 154, and recessed portions 173 are formed in positions along the edges on both sides of the protruding portion 171. The protruding portion 171 protrudes from the surface 159b, and the recessed portions 173 are recessed in the surface 159b. The protruding portions 171,172 and the recessed portions 170,173 are substantially rectangular in shape. As shown, the recessed portion 170 is formed in a position corresponding to the position of the protruding portion 171, and the protruding portions 172 are formed in positions corresponding to the positions of the recessed portions 173.

The abovementioned construction is formed by applying a force to the press-fitting section 154. Specifically, the recessed portion 170 and the protruding portion 171 can be simultaneously formed by applying a force to the press-fitting section 154 in the direction indicated by arrow F1 in FIG. 4b, and the protruding portions 172 and recessed portions 173 can be simultaneously formed by applying a force in the direction indicated by arrows F2.

An effect similar to that of contact 50 can be obtained using the contact 150. Specifically, when the tine section 151 of the contact 150 is soldered to a through-hole of the circuit board after the contact 150 has been press-fitted so that the contact 150 is held in place in the housing, the housing in the vicinity of the press-fitting section 154 is softened as a result of the heat conduction effect of the contact 150. The softened housing flows so that a configuration that complements the shape of the protruding portions 171,172 is formed; at the same time, the material of the housing flows into the interior portions of the recessed portions 170,173. Accordingly, when the housing again hardens following the completion of soldering, the retention strength with which the housing holds the contact 150 is extremely high.

Figure 5A:
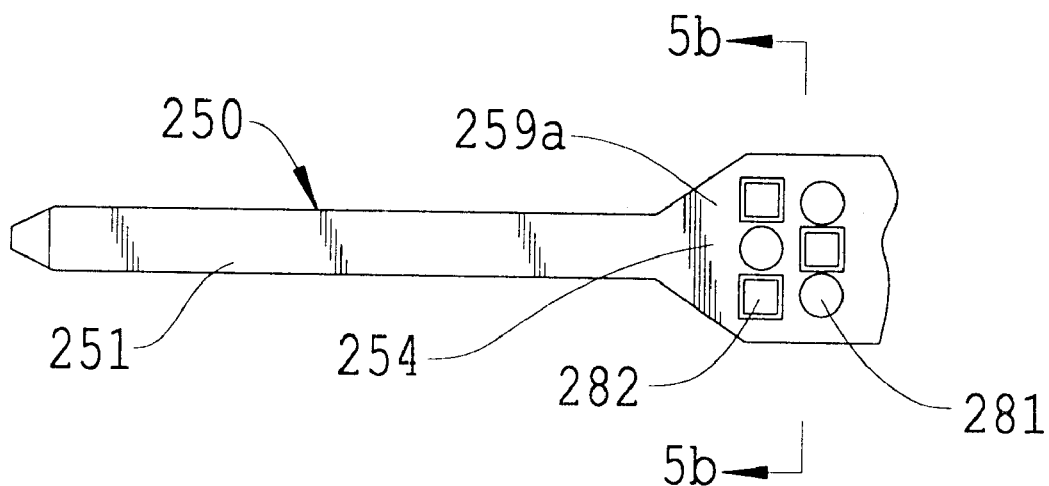
Figure 5B:
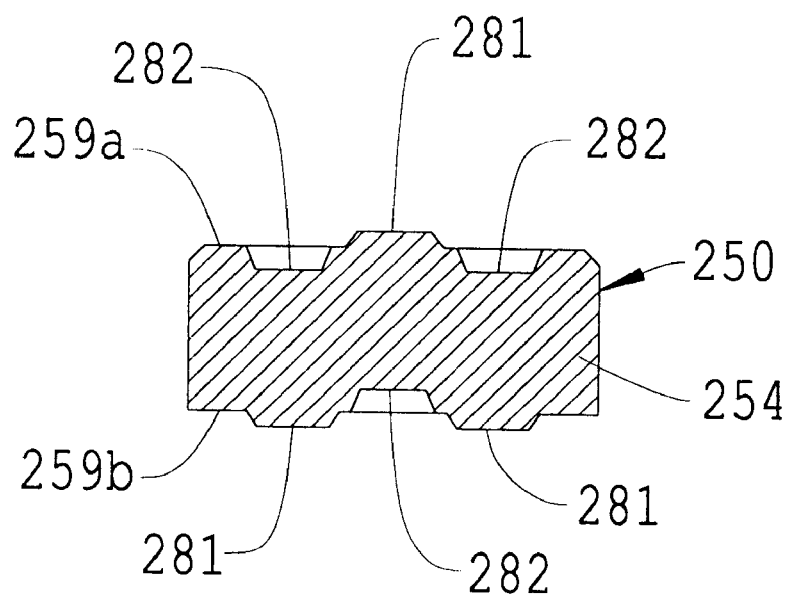

A portion of electrical contact 250 for use in a circuit board mounted connector that is constructed according to another embodiment that is similar to the contact 150 is shown in FIGS. 5a and 5b.

Like the contacts 50 and 150 shown and described above, the contact 250 is also a contact for use in a circuit board mounted connector that is press-fitted in a housing. The contact 250 differs from the contacts 50 and 150 in the shape of the press-fitting section 254. Substantially cylindrical protruding portions 281 and substantially rectangular recessed portions 282 are formed in a two-row matrix pattern with the protruding portions 281 and recessed portions 282 alternately positioned in two dimensions on the surface 259a on one side of the press-fitting section 254 from which the tine section 251 is extended. Meanwhile, on the surface 259b on the other side, recessed portions 282 and protruding portions 281 are formed in opposing positions corresponding respectively to the protruding portions 281 and recessed portions 282 on the surface 259a. The protruding portions 281 and recessed portions 282 are formed by the same method as in the contact 150. Protruding portions 281 and recessed portions 282 each form an isosceles triangle on each surface of the press-fitting section 254. In the process in which the tine section 251 is soldered, the same effect is generated as that described for the protruding portions 171,172 and recessed portions 170,173 in the contact 150. Compared to the protruding portions 171,172 and recessed portions 170,173 of the contact 150, the dimensions of the individual protruding portions 281 and recessed portions 282 are small; however, since a variation in terms of recessing and protrusion with respective portions recessed in or protruding from the surfaces can also be provided in the direction of length of the contact 250, the retention force of the contact 250 following the soldering of the tine section 251 is extremely high.

A circuit board mounted connector of the present invention, and contacts used in the connector, were described above. However, the embodiments described above are merely examples, and do not limit the present invention. Various modifications and alterations may be made by a person skilled in the art. As one example of such a modification, the shape of the recesses in the first embodiment is not limited to a substantially conical shape; it would also be possible to use a pyramidal shape such as a triangular pyramid or square pyramid. Furthermore, the protruding portions and recessed portions in the second and third embodiments may also be formed in a staggered arrangement.

A circuit board mounted connector of the present invention comprises substantially conical recesses formed in both surfaces of a press-fitting section of an electrical contact, with central portions of the recesses being located at positions that are lower than the corresponding surfaces, and with circumferential rim portions of the recesses being located at positions that are higher than the corresponding surfaces so that protruding portions are formed, and press-fitting cavities are located in a dielectric housing with dimensions that are substantially equal to the thickness dimensions between the surfaces of the press-fitting sections. Accordingly, the housing material that is softened during soldering flows so that a complementary shape is formed in the substantially conical recesses, and the housing material then hardens when soldering is completed. Consequently, the retention strength of the contacts with respect to the housing can be maintained at an extremely high level even after the connector is connected to a circuit board by soldering.

Furthermore, the circuit board mounted connector of the present invention comprises protruding portions that protrude from both surfaces of the press-fitting section and recessed portions that are recessed from the surfaces as they are formed side-by-side in the surfaces, and the press-fitting cavities have dimensions that are substantially equal to the thickness dimensions between the surfaces of the press-fitting sections. Accordingly, the housing material that is softened during soldering flows to form a shape that complements the protruding portions and recessed portions, after which it hardens; consequently, the retention strength of the contacts with respect to the housing can be maintained at an extremely high level even after the connector is fastened to the circuit board.

Furthermore, a contact of the present invention comprises substantially conical recesses formed in both surfaces of a press-fitting section, with central portions of the recesses being located at positions that are lower than the corresponding surfaces, and with circumferential rim portions of the recesses being located at positions that are higher than the corresponding surfaces so that protruding portions are formed. Accordingly, a construction can be realized relatively simply and in an easily manufacturable form, that makes it possible to obtain a strong retaining force with respect to a housing even in cases where a heat treatment such as soldering, is performed after the contact has been press-fitted in the housing.

Furthermore, in the connector of the present invention, protruding portions that protrude from both surfaces of the press-fitting section and recessed portions that are recessed from the surfaces are formed side-by-side in the surfaces; accordingly, a construction can be realized relatively simply and in an easily manufacturable form, that makes it possible to obtain a strong retaining force with respect to a housing even in cases where a heat treatment such as soldering, is performed after the contacts have been press-fitted in the housing.

I claim:

1. An electrical connector for mounting onto a circuit board comprising:

a dielectric housing having press-fitting cavities;

electrical contacts having press-fitting sections which are press fitted along a longitudinal axis of each of the contacts into the press-fitting cavities and tine sections for soldered connection to the circuit board; and recess portions located in surfaces of the press-fitting sections and protruding portions extending outwardly from the surfaces of the press-fitting sections so that when the tine sections are soldered to the circuit board, the housing material in the press-fitting sections will flow into the recess portions and adjacent the protruding portions so as to correspond to the shape of the recess portions and protruding portions, wherein the recess portions are shaped so as to hold and surround a portion of the housing material which has flowed into the recess portions in order to provide a suitable contact retaining force for each of the contacts along a range of axes ranging between the longitudinal axis and a second axis which is substantially perpendicular to the longitudinal axis thereby securely retaining the contacts in the housing.

2. An electrical connector as claimed in claim 1, wherein the recess portions are conically-shaped recesses and the protruding portions are circumferential rim portions around the recesses.

3. An electrical connector as claimed in claim 2, wherein the conically-shaped recesses form an isosceles triangle with one of the conically-shaped recesses being located on the longitudinal axis of the contact and the other of the conically-shaped recesses being located on each side of the longitudinal axis.

4. An electrical connector as claimed in claim 1, wherein the recess portions and the protruding portions have a rectangular shape.

5. An electrical connector as claimed in claim 4, wherein the protruding portions on one surface are located on each side of a recess portion, and the protruding portion on the other surface is located between two recess portions.

6. An electrical connector as claimed in claim 1, wherein the protruding portions and the recess portions on each surface of the press-fitting section form isosceles triangles.

7. An electrical connector as claimed in claim 6, wherein the protruding portions are circular shaped, and the recess portions are rectangular shaped.

8. An electrical connector as claimed in claim 1, where said press-fitting cavities have shoulders and said press-fitting section have retention members engaging said shoulders.

9. An electrical contact for mounting in a press-fitting cavity of a dielectric housing, comprising:

a press-fitting section for press-fitting engagement along a longitudinal axis of the contact with the press-fitting cavity and a tine section;

recess portions located in surfaces of the press-fitting section and protruding portions extending outwardly from the surfaces of the press-fitting section so that when the tine section is soldered to a circuit board, the housing material in the press-fitting section will flow into the recess portions and adjacent the protruding portions so as to correspond to the shape of the recess portions and protruding portions, wherein the recess portions are shaped so as to hold and surround a portion of the housing material which has flowed into the recess portions in order to provide a suitable retaining force for the contact along a range of axes ranging between the longitudinal axis and a second axis which is substantially perpendicular to the longitudinal axis thereby retaining the contact in the housing.

10. An electrical contact as claimed in claim 9, wherein the recess portions are conically-shaped recesses and the protruding portions are circumferential rim portions around the recesses.

11. An electrical contact as claimed in claim 10, wherein the conically-shaped recesses form an isosceles triangle with one of the conically-shaped recesses being located on the longitudinal axis of the contact and the other of the conically-shaped recesses being located on each side of the longitudinal axis.

12. An electrical contact as claimed in claim 9, wherein the recess portions and the protruding portions have a rectangular shape.

13. An electrical contact as claimed in claim 12, wherein the protruding positions on one surface are located on each side of a recess portion, and the protruding portion on the other surface is located between two recess portions.

14. An electrical contact as claimed in claim 9, wherein the protruding portions and the recess portions on each surface of the press-fitting section form isosceles triangles.

15. An electrical contact as claimed in claim 14, wherein the protruding portions are circular shaped, and the recess portions are rectangular shaped.

16. An electrical contact as claimed in claim 9, wherein the press-fitting section has retention members for engaging shoulders in the press-fitting cavity.

17. An electrical connector for mounting onto a circuit board comprising:

a dielectric housing having press-fitting cavities;

electrical contacts having press-fitting sections press fitted into the press-fitting cavities and tine sections for soldered connection to the circuit board; and recess portions located in surfaces of the press-fitting sections, wherein the recess portions are conically-shaped and wherein the conically-shaped recesses form an isosceles triangle with one of the conically-shaped recesses being located on a longitudinal axis of the contact and the other of the conically-shaped recesses being located on each side of the longitudinal axis, the press fitting sections further including protruding portions extending outwardly from the surfaces of the press-fitting sections, wherein the protruding portions are circumferential rim portions around the recess, so that when the tine sections are soldered to the circuit board, the housing material in the press-fitting sections will flow so as to correspond to the shape of the recess portions and protruding portions thereby securely retaining the contacts in the housing.

18. An electrical connector as claimed in claim 17, wherein the recess portions and the protruding portions have a rectangular shape.

19. An electrical connector as claimed in claim 17, wherein the protruding portions on one surface are located on each side of a recess portion, and the protruding portion on the other surface is located between two recess portions.

20. An electrical connector for mounting onto a circuit board comprising:

a dielectric housing having press-fitting cavities;

electrical contacts having press-fitting sections press fitted into the press-fitting cavities and tine sections for soldered connection to the circuit board; and recess portions located in surfaces of the press-fitting sections and protruding portions extending outwardly from the surfaces of the press-fitting sections, wherein the protruding portions and the recess portions on each surface of the press-fitting sections form isosceles triangles, so that when the tine sections are soldered to the circuit board, the housing material in the press-fitting sections will flow so as to correspond to the shape of the recess portions and protruding portions thereby securely retaining the contacts in the housing.

21. An electrical connector as claimed in claim 20, wherein the protruding portions are circular shaped, and the recess portions are rectangular shaped.

22. An electrical connector as claimed in claim 20, where said press-fitting cavities have shoulders and said press-fitting sections have retention members engaging said shoulders.

23. An electrical contact for mounting in a press-fitting cavity of a dielectric housing, comprising:

a press-fitting section for press-fitting engagement with the press-fitting cavity and a tine section;

recess portions located in surfaces of the press-fitting section, wherein the recess portions are conically-shaped recesses and wherein the conically-shaped recesses form an isosceles triangle with one of the conically-shaped recesses being located on a longitudinal axis of the contact and the other of the conically-shaped recesses being located on each side of the longitudinal axis, the press fitting section further including protruding portions extending outwardly from the surfaces of the press-fitting section, wherein the protruding portions are circumferential rim portions around the recesses, so that when the tine section is soldered to a circuit board, the housing material in the press-fitting section will flow so as to correspond to the shape of the recess portions and protruding portions thereby retaining the contact in the housing.

24. An electrical contact as claimed in claim 23, wherein the recess portions and the protruding portions have a rectangular shape.

25. An electrical contact as claimed in claim 23, wherein the protruding positions on one surface are located on each side of a recess portion, and the protruding portion on the other surface is located between two recess portions.

26. An electrical contact for mounting in a press-fitting cavity of a dielectric housing, comprising:

a press-fitting section for press-fitting engagement with the press-fitting cavity and a tine section;

recess portions located in surfaces of the press-fitting section and protruding portions extending outwardly from the surfaces of the press-fitting section, wherein the protruding portions and the recess portions on each surface of the press-fitting section form isosceles triangles, so that when the tine section is soldered to a circuit board, the housing material in the press-fitting section will flow so as to correspond to the shape of the recess portions and protruding portions thereby retaining the contact in the housing.

27. An electrical contact as claimed in claim 26, wherein the protruding portions are circular shaped, and the recess portions are rectangular shaped.

28. An electrical contact as claimed in claim 26, wherein the press-fitting section has retention members for engaging shoulders in the press-fitting cavity.

\* \* \* \* \*